(12) United States Patent
Kim et al.

(10) Patent No.: US 8,206,609 B2
(45) Date of Patent: Jun. 26, 2012

(54) REDUCING AGENT FOR LOW TEMPERATURE REDUCING AND SINTERING OF COPPER NANOPARTICLES

(75) Inventors: In-Young Kim, Suwon-si (KR); Jae-Woo Joung, Suwon-si (KR); Young-Ah Song, Suwon-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 441 days.

(21) Appl. No.: 12/435,180

(22) Filed: May 4, 2009

(65) Prior Publication Data

US 2010/0055302 A1    Mar. 4, 2010

(30) Foreign Application Priority Data

Sep. 4, 2008    (KR) .................. 10-2008-0087247

(51) Int. Cl.
*C09K 3/00* (2006.01)
*B22F 1/00* (2006.01)
*B22F 1/02* (2006.01)

(52) U.S. Cl. ........ 252/188.1; 419/56; 419/57; 427/96.7; 427/98.4

(58) Field of Classification Search ............... 252/188.1; 419/56, 57; 427/96.7, 98.4
See application file for complete search history.

(56) References Cited

U.S. PATENT DOCUMENTS

| | | | | | |
|---|---|---|---|---|---|
| 1,961,737 | A | * | 6/1934 | Carlin et al. | 562/519 |
| 3,524,862 | A | * | 8/1970 | Conover | 548/248 |
| 3,657,118 | A | * | 4/1972 | Kraffczyk et al. | 210/658 |
| 4,435,595 | A | * | 3/1984 | Agreda et al. | 560/234 |
| 5,296,630 | A | * | 3/1994 | Erpenbach et al. | 560/265 |
| 5,334,755 | A | * | 8/1994 | Yoneda et al. | 562/519 |
| 6,165,723 | A | * | 12/2000 | Shah et al. | 435/6.14 |
| 6,432,472 | B1 | * | 8/2002 | Farrell et al. | 427/79 |
| 6,781,014 | B1 | * | 8/2004 | Vidalin et al. | 562/607 |
| 2009/0221725 | A1 | * | 9/2009 | Chornet et al. | 518/726 |
| 2009/0270650 | A1 | * | 10/2009 | Patt | 562/517 |
| 2009/0326080 | A1 | * | 12/2009 | Chornet et al. | 518/726 |

* cited by examiner

*Primary Examiner* — Joseph D Anthony

(74) *Attorney, Agent, or Firm* — McDermott Will & Emery LLP

(57) ABSTRACT

The present invention relates to a reducing agent for low temperature reducing and sintering of copper nanoparticles and a method for low temperature sintering using the same. The reducing agent includes formic acid or acetic acid and C1 to C3 alcohol or ether which allows reducing and sintering at a low temperature of less than 250° C. The sintered copper nanoparticles provide excellent electrical properties and are suitable for forming fine wirings patterns.

1 Claim, 3 Drawing Sheets

REDUCING AGENT FOR LOW TEMPERATURE REDUCING AND SINTERING OF COPPER NANOPARTICLES

CROSS-REFERENCE TO RELATED APPLICATIONS

This application claims the benefit of Korean Patent Application No. 10-2008-0087247 filed with the Korean Intellectual Property Office on Sep. 4, 2008, the disclosure of which is incorporated herein by reference in its entirety.

BACKGROUND

1. Technical Field

The present invention relates to a reducing agent for low temperature reducing and sintering of copper nanoparticles and a method for low temperature sintering using the same.

2. Description of Related Art

Industrial inkjet printing technology has a number of advantages in economy of energy, low cost, multilayer lamination, formation of thin films and so on since it only uses material where it is needed with little or no waste and allows formation of finer patterns. Manufacturing products using inkjet printing needs technologies in preparation of particles for ink, combination of inks, inkjet head design to inject desired amount of ink, system to inkjet droplets where it is needed, printing to form fine wires, surface treatment, sintering and the like. Researches on materials suitable for inkjet printing have been expanded diversely to metals, ceramics, polymers, bio- and hybrid-inks, etc.

In methods for forming fine wiring patterns using metal nano-ink, methods using gold nanoparticles or silver nanoparticles have been developed.

In case of using gold nanoparticles, gold itself is costly, lending to high manufacturing unit cost of gold nanoparticles dispersion so that it presents a limitation to mass production in terms of economy.

Silver has been the most widely researched for the formation of inkjet printed metal wirings. Silver nanoparticle ink allows easy formation of metal wirings by steps of printing and heat treating in air and simultaneously provides electrical characteristics. However, silver nanoparticles are inefficient for high material price and cause disconnection (or opening) for electro-migration when width or space between wires becomes narrow.

Due to such problems of high material cost and disconnection of wires for electro-migration, copper has attracted great interest and there have been recently great researches on using copper. However, a disadvantage of copper nanoparticles is their tendency to oxidize easily compared to gold or silver which does not show oxidation problem.

Therefore, since copper nanoparticle ink is easily oxidized when it gets contact with ambient air during the sintering process, the sintering process requires essentially reducing atmosphere and the sintering temperature should be lower than the glass transition temperature of a polymer substrate to apply it to the polymer substrate.

A general method is a method to conduct the sintering process under the reducing atmosphere using hydrogen gas. However, the sintering is allowed only when it is heated at 250° C. or higher for a long period of time and the specific resistance is very high with this method. Thus, it is not practical since the glass transition temperatures of most of polymer substrates are 250° C. or lower.

Therefore, there is a large demand to develop low temperature reducing and sintering methods of copper nanoparticles which allow the sintering of copper nanoparticles at 250° C. or lower and result a low specific resistance.

SUMMARY

The invention is to provide a reducing agent for low temperature reducing and sintering of copper nanoparticles and a method for low temperature sintering using the same in order to resolve the problems described above.

In an aspect of the invention, there is provided a reducing agent for low temperature sintering of copper nanoparticles, including formic acid or acetic acid and C1 to C3 alcohol or ether.

According to an embodiment of the invention, the reducing agent may include formic acid or acetic acid and alcohol or ether in a weight ratio of 3:7 to 8:2, preferably in a weight ratio of 6:4 to 7:3.

According to an embodiment of the invention, the reducing agent may be applied as a reducing atmospheric gas during the sintering process of copper nanoparticles.

According to an embodiment of the invention, the alcohol may be one chosen from methanol, ethanol and isopropanol.

According to an embodiment of the invention, the reduction agent may include formic acid and methanol in a weight ratio of 3:7 to 8:2, preferably in a weight ratio of 6:4 to 7:3 and be applied as a reducing atmospheric gas during the sintering process of copper nanoparticles.

In another aspect of the invention, there is provided a method for low temperature sintering of copper nanoparticles including employing the reducing agent described above as a reducing agent of copper nanoparticles and heating the copper nanoparticles to a temperature of lower than 250° C.

According to an embodiment of the invention, the reducing agent may be applied as a reducing atmospheric gas during the sintering process of copper nanoparticles.

According to an embodiment of the invention, the applying of a reducing atmospheric gas may be conducted by injecting the liquid reducing agent, in which a nitrogen gas is used as a carrier gas to form bubbles, into a reduction sintering furnace.

In another aspect of the invention, there is provided a method for forming copper wiring patterns on a substrate including: printing wiring patterns by using a dispersion of copper nanoparticles on a substrate; and employing the reducing agent of the invention as a reducing agent of copper nanoparticles and sintering by heating the copper nanoparticles to a temperature of less than 250° C.

Additional aspects and advantages of the present invention will be set forth in part in the description which follows, and in part will be obvious from the description, or may be learned by practice of the invention.

DETAILED DESCRIPTION

Figure 1:
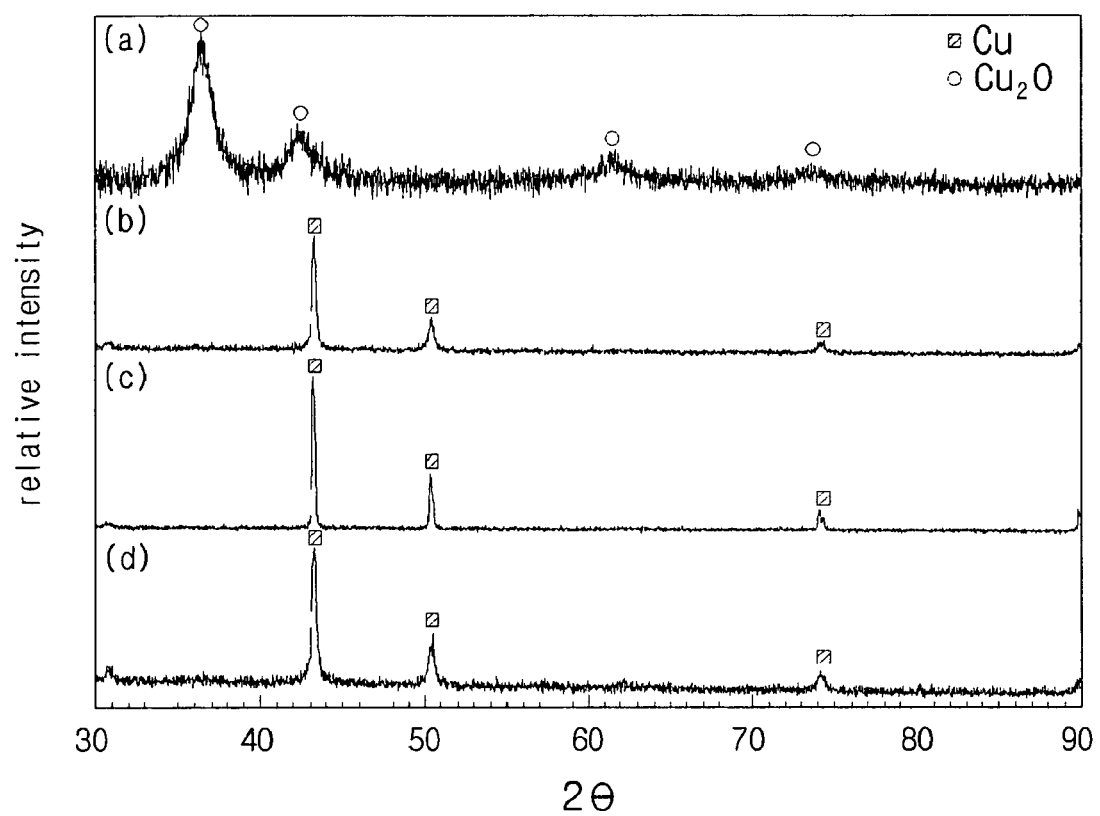
FIG. 1 is X-ray diffraction results of sintered copper wirings at various conditions.

Hereinafter, a reducing agent for low temperature reducing and sintering of copper nanoparticles, a method for low temperature reducing and sintering of copper nanoparticles using the same, and a method for forming copper wiring patterns according to the invention will be described in detail.

Reducing Agent for Low Temperature Sintering of Copper Nanoparticles

The inventors of the invention have studied to develop a reducing agent to effectively reduce and sinter copper nanoparticles, which are printed on a substrate and oxidized by an organic compound alone or a combination of organic compounds, in order to resolve the problems described above. As a result, they found a reducing agent including formic acid or acetic acid and C1 to C3 alcohol or ether which was suitable for low temperature sintering of copper nanoparticles.

Hydrogen gas, usually used for a reducing atmospheric gas during the sintering, requires sintering at a high temperature for a long period of time and results in relatively a high specific resistance after the sintering process so that it is not suitable for sintering of printed copper nanoparticles. Therefore, it is apparent that an appropriate reducing agent should have lower Gipp's free energy ($\Delta G$) in a reduction reaction than that ($\Delta G(400°\ C.)=-91$ kJ) of a reduction reaction of hydrogen and copper oxide. Examples of the reducing agent may include alcohol ($\Delta G(310°\ C.)=-102$ kJ), formic acid ($\Delta G(310°\ C.)=-161$ kJ) and acetic acid ($\Delta G(310°\ C.)=-99$ kJ), etc.

In case of alcohol and acetic acid, a reduction reaction rate is relatively low but in case of formic acid, it is fast even at a low temperature.

When formic acid is used, a reduction of copper oxide occurs from a temperature of 150° C. and a specific resistance of copper wirings is about 4 $\mu\Omega\cdot$cm after sintering. It is noted that formic acid is efficient to lower a sintering temperature of copper nanoparticles and to provide excellent electrical properties.

On the other hand, when formic acid or acetic acid is used as a reducing agent for sintering, the acid reacts with reduced copper particles which are further etched. Such copper particles are then adhered back to a substrate and contaminate the substrate where wirings are not formed.

In order to eliminate such problems, C1 to C3 alcohol, such as methanol, ethanol or isopropanol, or ether is added in an appropriate ratio. As a result, reduction characteristics of formic acid or acetic acid may be maintained and etching of copper particles and contamination of a substrate may be reduced.

When formic acid or acetic acid and alcohol or ether is added in a weight ratio of 3:7 to 8:2, it allows sintering at a low temperature and provides a specific resistance of about 20 $\mu\Omega\cdot$cm or lower and at the same time it reduces etching of copper particles and contamination of a substrate. Changes in a weight ratio of a reducing agent may be varied in some ranges according to a concentration of copper ink. A ratio of formic acid or acetic acid may be further reduced if copper wirings having a specific resistance of 20 $\mu\Omega\cdot$cm or higher are produced.

When formic acid or acetic acid and alcohol or ether are mixed in a weight ratio of 6:4 to 7:3, it may allow low temperature sintering, provide a specific resistance of 10 $\mu\Omega\cdot$cm or lower, and reduce etching of copper and contamination of a substrate.

An example of the reducing agent is formic acid. When it is used by 40 wt % or more, it may exhibit the minimum specific resistance. Fine structure of the sintered copper wirings may be ununiform of bimodal structure when amount of methanol or ethanol is high. However, it may become uniform by maintaining uniform particle size when amount of formic acid increases.

Therefore, instead of simply using an acid-based reducing agent which has excellent reductivity, an appropriate mixture of solvents according to characteristics of etching and contamination of a substrate may be used as a reducing agent to allow an optimum reduction and sintering of copper.

Method for Low Temperature Reducing and Sintering of Copper Nanoparticles

The reduction and sintering of the copper nanoparticles may be obtained by employing the reducing agent of a mixture of formic acid or acetic acid and alcohol or ether as a reducing agent of copper nanoparticles and heating the copper nanoparticles as described above.

A sintering temperature may be lower than Tg (glass transition temperature) of a polymer substrate, about lower than 250° C. Tg of an organic compound usually used for a substrate is about 130° C. to 250° C. but when a mixture of organic compounds are used, it may be somewhat different. When an electrode is formed on the surface of a packaging material such as polyethylene or polypropylene, a sintering temperature should be far lower since Tg thereof is low. In this case, a sintering temperature is about 100° C.

The reducing agent of the invention may be provided as a reducing atmospheric gas into a sintering furnace. Methods for providing the reducing atmospheric gas may be various. As an example, a reducing agent may be injected into a sintering furnace by using nitrogen gas as a carrier gas to form bubbles in a liquid reducing agent.

Method for Forming Copper Wiring Patterns on a Substrate

Copper wiring patterns may be formed on a substrate by employing the method for low temperature reducing and sintering of copper nanoparticles described above.

According to an embodiment, copper wiring patterns may be formed on a substrate by employing a method including: printing wiring patterns by using a dispersion of copper nanoparticles such as copper nano-ink on a substrate; and using the reducing agent described above as a reducing agent of the copper nanoparticles and sintering by heating the copper nanoparticles to a temperature of 250° C. or lower. Here, the printing step may be an inkjet printing process.

The reducing agent of the invention may allow reduction of oxidized copper nanoparticles at a temperature of 250° C. or lower and simultaneously sinter the copper nanoparticles so that the method for forming wiring patterns using the copper nanoparticles may be suitable for industrial mass productions.

It is to be appreciated that various changes and modifications for methods of forming copper wiring patterns may be made by those skilled in the art if the method includes employing of the reducing agent of the invention and low temperature reducing and sintering.

Hereinafter, although more detailed descriptions will be given by examples, those are only for explanation and there is no intention to limit the invention.

EXAMPLES

Comparison Examples

Reducing and Sintering of Copper Nanoparticles Using Various Reducing Agent Themselves (1) Sintering of Copper Nanoparticles without Using a Reducing Agent After forming wiring patterns on a substrate by an inkjet printing process with using copper nano-ink, it was sintered by heating in air without using a reducing agent. It was noted from the X-ray diffraction that the printed copper ink was oxidized to copper oxide ($Cu_2O$).

(2) Reducing and Sintering of Copper Nanoparticles Using Hydrogen Gas

After forming copper wiring patterns on a substrate as in Comparison Example (1), it was sintered by heating to various temperatures by employing hydrogen gas as a reducing atmospheric gas. The copper nanoparticles were neither reduced nor sintered at a temperature of lower than 250° C. However, when the copper nanoparticles were sintered by heating at a temperature of 250° C. for more than 6 hours, a specific resistance was very high, about $10^{-5} \Omega \cdot cm$.

(3) Reducing and Sintering of Copper Nanoparticles Using Methanol

After forming copper wiring patterns on a substrate as in Comparison Example (1), it was sintered by applying methanol as a reducing atmospheric gas in which nitrogen gas is used as a carrier gas to form bubbles, into a sintering furnace and heating at various temperatures. The copper nanoparticles were reduced at a temperature of 200° C. but the copper nanoparticles were sintered for a relatively long period of time and had a high specific resistance.

(4) Reducing and Sintering of Copper Nanoparticles Using Acetic Acid

After forming copper wiring patterns on a substrate as in Comparison Example (1), it was sintered by applying acetic acid as a reducing atmospheric gas, in which nitrogen gas is used as a carrier gas to form bubbles, into a sintering furnace and heating at various temperatures. The copper nanoparticles were reduced at a temperature of 200° C. but the copper nanoparticles were sintered for a relatively long period of time and had a high specific resistance. Etching of copper by using an acid and contamination of a substrate where wirings were not formed was also noted.

(5) Reducing and Sintering of Copper Nanoparticles Using Formic Acid

After forming copper wiring patterns on a substrate as in Comparison Example (1), it was sintered by applying formic acid as a reducing atmospheric gas, in which nitrogen gas is used as a carrier gas to form bubbles, into a sintering furnace and heating at various temperatures. The copper nanoparticles were reduced from a temperature of 150° C.

The printed copper wirings were analyzed by the X-ray diffraction if copper oxide was reduced to the corresponding copper. The result is shown in FIG. 1 of which (a) is the case of sintering in air without using any reducing agent, (b) is the case of sintering at 150° C. under the formic acid gas environment, (c) is the case of sintering at 230° C. under the formic acid gas environment, and (d) is the case of sintering at 230° C. under the methanol gas environment. It is noted that the copper oxide is reduced to the corresponding copper in all cases, except the (a) case.

Figure 2:
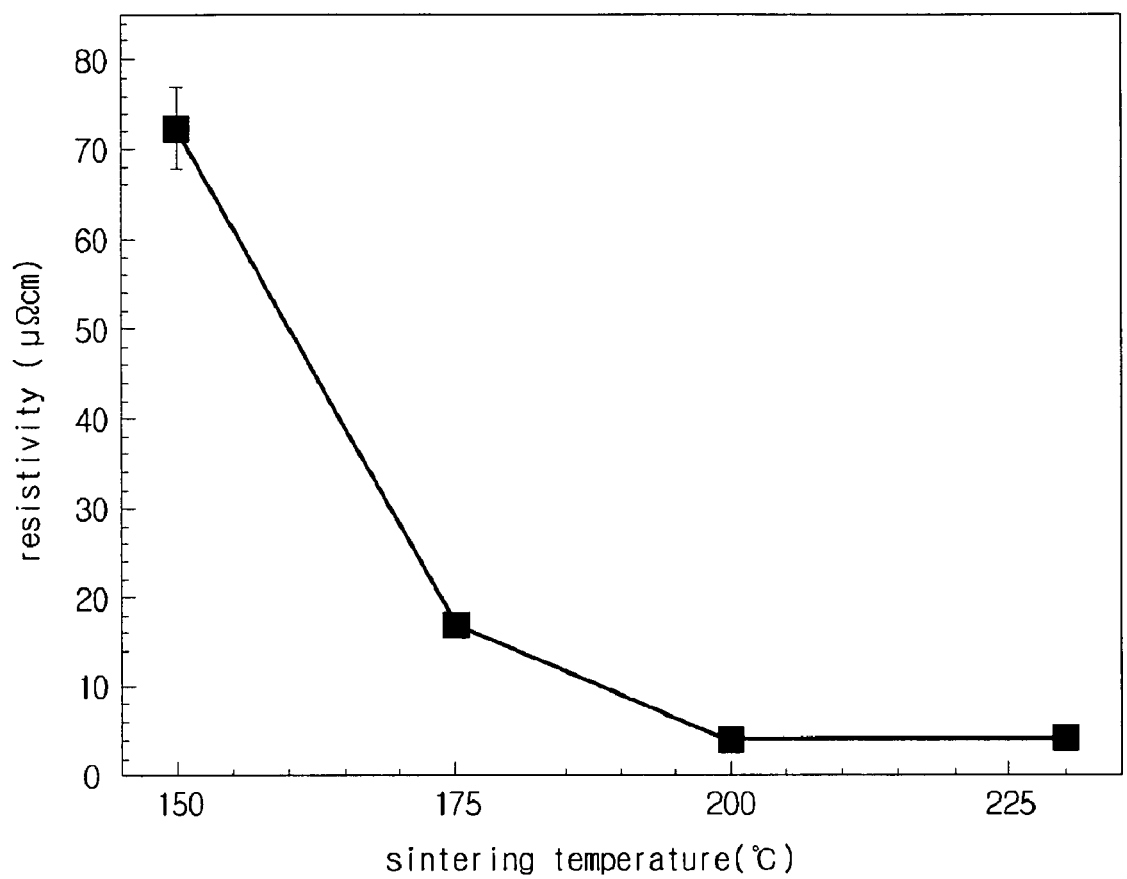
FIG. 2 is a graph of a specific resistance of copper wirings according to a sintering temperature when formic acid is used as a reducing agent.

When formic acid was used as a reducing agent, a specific resistance of the copper wirings was determined according to a sintering temperature and the result was shown in FIG. 2. It was noted that the specific resistance was about 4 $\mu\Omega \cdot cm$ from a temperature of 200° C.

On the other hand, when acetic acid was used as a reducing agent, it was noted that copper was etched due to using of an acid material and contamination of a substrate was caused.

EXAMPLES

Reducing and Sintering of Copper Nanoparticles Using a Mixture of Formic Acid and Alcohol or Ether (1) Reducing and Sintering of Copper Nanoparticles Using a Mixture of Formic Acid and Methanol After forming copper wiring patterns on a substrate as in Comparison Example (1), it was sintered by applying a mixture of formic acid and methanol mixed in various weight ratios as a reducing atmospheric gas, in which nitrogen gas is used as a carrier gas to form bubbles, into a sintering furnace and heating at various temperatures.

The weight ratios of formic acid and methanol applied as a reducing atmospheric gas were 0:10 (Comparison Example (3)), 1:9, 2:8, 3:7, 4:6, 5:5, 6:4, 7:3, 8:2, 9:1 and 10:0 (Comparison Example (5)).

Figure 3:
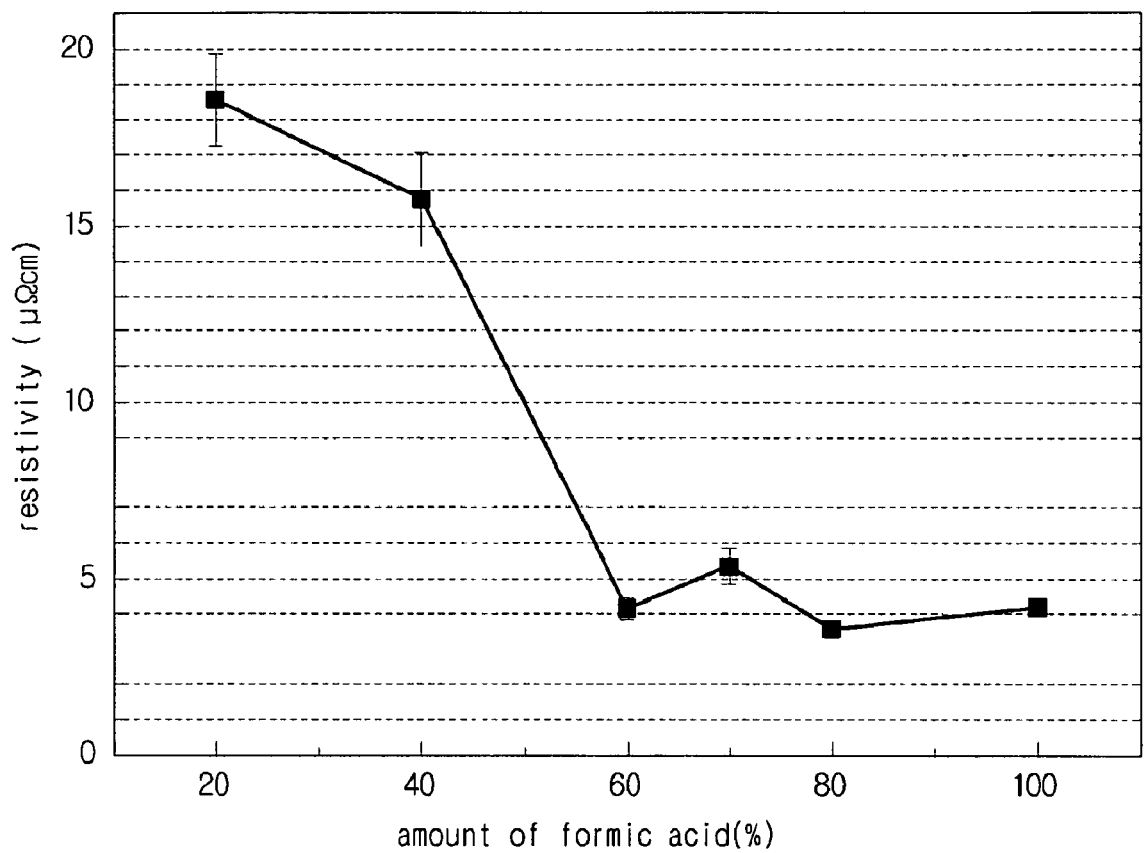
FIG. 3 is a graph of a specific resistance of copper wirings according to an amount of forming acid when a mixture of formic acid and methanol is used as a reducing agent.

Specific resistances were determined according to amount of formic acid and the result was shown in FIG. 3.

When the weight ratio of formic acid and methanol was 8:2 or lower, etching of copper and contamination of the substrate were reduced and when it was 3:7 or higher, it was noted that the specific resistance was low enough. It was preferable when the weight ratio was 6:4 to 7:3. It was noted that the particle size distribution was ununiform of bimodal when large amount of methanol was used but it became uniform with increase the amount of formic acid.

(2) Reducing and Sintering of Copper Nanoparticles Using a Mixture of Formic Acid and Ethanol After forming copper wiring patterns on a substrate as in Comparison Example (1), it was sintered by applying a mixture of formic acid and ethanol mixed in various weight ratios as a reducing atmospheric gas, in which nitrogen gas is used as a carrier gas to form bubbles, into a sintering furnace and heating at various temperatures.

Specific resistances were determined and the result was almost identical to that of Example (1) when formic acid and methanol were mixed. When a mixture of formic acid and ethanol mixed in a weight ratio of 7:3 was applied as a reducing atmospheric gas and the sintering was performed for 1 hour at 200° C., the specific resistance was about 4 $\mu\Omega\cdot$cm.

Etched degree and contamination degree of the substrate was also almost identical to that when formic acid and methanol were mixed and optimum mixing ratio was 6:4 to 7:3 (data was omitted).

(3) Reducing and Sintering of Copper Nanoparticles Using a Mixture of Formic Acid and Ether After forming copper wiring patterns on a substrate as in Comparison Example (1), it was sintered by applying a mixture of formic acid and ether having hydroxyl group(s) mixed in various weight ratios as a reducing atmospheric gas, in which nitrogen gas is used as a carrier gas to form bubbles, into a sintering furnace and heating at various temperatures.

It was noted that the specific resistance, etched degree and contamination degree of the substrate were improved (date was omitted).

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A reducing agent consisting essentially of:
   formic acid;
   and methanol, ethanol, or ethyl ether in a weight ratio of 6:4 to 7:3 with respect to the formic acid, wherein the reducing agent is applied as a reducing atmospheric gas during a sintering process of copper nanoparticles.

* * * * *